United States Patent
Lipson et al.

(10) Patent No.: US 7,335,398 B2
(45) Date of Patent: Feb. 26, 2008

(54) METHOD TO MODIFY THE SPATIAL RESPONSE OF A PATTERN GENERATOR

(75) Inventors: Matthew Lipson, Stamford, CT (US); Ronald A. Wilklow, Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 343 days.

(21) Appl. No.: 10/898,160

(22) Filed: Jul. 26, 2004

(65) Prior Publication Data

US 2006/0019030 A1 Jan. 26, 2006

(51) Int. Cl.
  *C23C 16/00* (2006.01)
  *B05D 5/00* (2006.01)
(52) U.S. Cl. .................................. 427/248.1; 427/256
(58) Field of Classification Search ............... None
See application file for complete search history.

(56) References Cited

U.S. PATENT DOCUMENTS

| | | | |
|---|---|---|---|
| 4,968,117 A * | 11/1990 | Chern et al. ............... | 359/573 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,211,997 B1 * | 4/2001 | Nutt et al. ................... | 359/290 |
| 6,582,875 B1 * | 6/2003 | Kay et al. ................... | 430/200 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |
| 2006/0139729 A1 | 6/2006 | Roux | |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—Timothy Meeks
*Assistant Examiner*—Kelly M Stouffer
(74) *Attorney, Agent, or Firm*—Sterne, Kessler, Goldstein & Fox PLLC

(57) ABSTRACT

Systems and methods are used to modify a layer on a substrate that is used to form a pattern generator, so that light reflecting from the modified substrate has a trapezoidal or other custom profile. The layer is modified using various vapor deposition techniques in conjunction with moving or positioning the substrate a desired distance from a blocking device and/or at a desired rate or speed.

21 Claims, 7 Drawing Sheets

METHOD TO MODIFY THE SPATIAL RESPONSE OF A PATTERN GENERATOR

BACKGROUND OF THE INVENTION

1. Field of the Invention

The present invention is related to a lithography system.

2. Background Art

Pattern generators are used to form patterned radiation images in many environments. For example, pattern generators can be used in televisions, biomedical patterning applications, lithography, and the like.

When used in lithography systems, the pattern generators are used to pattern substrates during an exposure process. Example lithography systems include, but are not limited to, reflective or transmissive maskless, immersion, and mask-based photolithography. Example substrates include, but are not limited to, semiconductor wafers, flat panel display substrates, flexible substrates, and the like. Light interacting with an illumination spot on the pattern generator becomes patterned. The patterned light is projected using a projection optical system onto one or more target areas of the substrate during the exposure process to form features on the substrate.

Features larger than the projected image of the pattern generator are created by incrementing the substrate between exposure periods. However, any error in the distance the substrate is moved between exposures will lead to a finite region of either double exposure or no exposure on the substrate. To loosen the requirements on positioning of the substrate, a technique known as stitching may be used; the substrate is moved between exposures just less than the size of the projected image of the pattern generator yielding an overlap region. The spatial profile of the illumination of the pattern generator must therefore be modified such that the total intensity incident on the substrate in the overlap region from two exposures is equal to the total intensity incident on the substrate in the non-overlap regions. A trapezoidal illumination profile, as shown in FIG. 4, is one custom profile that accomplishes this.

The optimal location for the creation of a custom illumination profile that will not modify the pupil of the imaging system is at an image plane. The surface of the pattern generator is one such location. Therefore, what is needed is a system and method to modify the spatial response of a pattern generator.

BRIEF SUMMARY OF THE INVENTION

An embodiment of the present invention provides a method that includes the steps of (a) directing a material towards a layer of a pattern generator device to form a coating on the layer and (b) blocking at least some of the material from reaching the layer during step (a), such that a shape of light reflected from the coating on the pattern generator device during operation forms a trapezoidal pattern.

Another embodiment of the present invention provides an apparatus including a device for directing a material towards a layer of a pattern generator device to form a coating on the layer and a device for blocking at least some of the material from reaching the layer, such that a shape of light reflected from the coating on the pattern generator device during operation forms a trapezoidal pattern.

A further embodiment of the present invention provides a method for modifying elements of a pattern generator, comprising the steps of providing the pattern generator having elements associated therewith and forming a radiation absorbing or scattering layer on at least a portion of the elements of the pattern generator.

A still further embodiment of the present invention provides a method for patterning a substrate, comprising the steps of directing radiation toward a pattern generator, the pattern generator having formed on at least a portion thereon a radiation absorption layer and positioning elements of the pattern generator to form trapezoidal patterns on regions of the substrate.

A still further embodiment of the present invention provides a method comprising for modification of a spatial light modulator (SLM) to aid spatial stitching of images projected by the SLM onto a substrate comprising the steps of (a) directing a modifying device towards a surface of the SLM and (b) modifying a portion of the surface of the SLM to thereby change an optical response of the SLM in a controlled manner.

In one example, step (b) causes the SLM to have a non-varying optical response, while in another example step (b) causes the SLM to have a continuously varying optical response.

In the example having a continuously varying optical response, in one example the continuously varying optical response has a linearly varying profile, while in another example the continuously varying optical response has a non-linearly varying profile.

Further embodiments and features of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1, 2, and 3 show a system that patterns a pattern generator device so that the pattern generator forms trapezoidally shaped light according to embodiments of the present invention.

Figure 1:
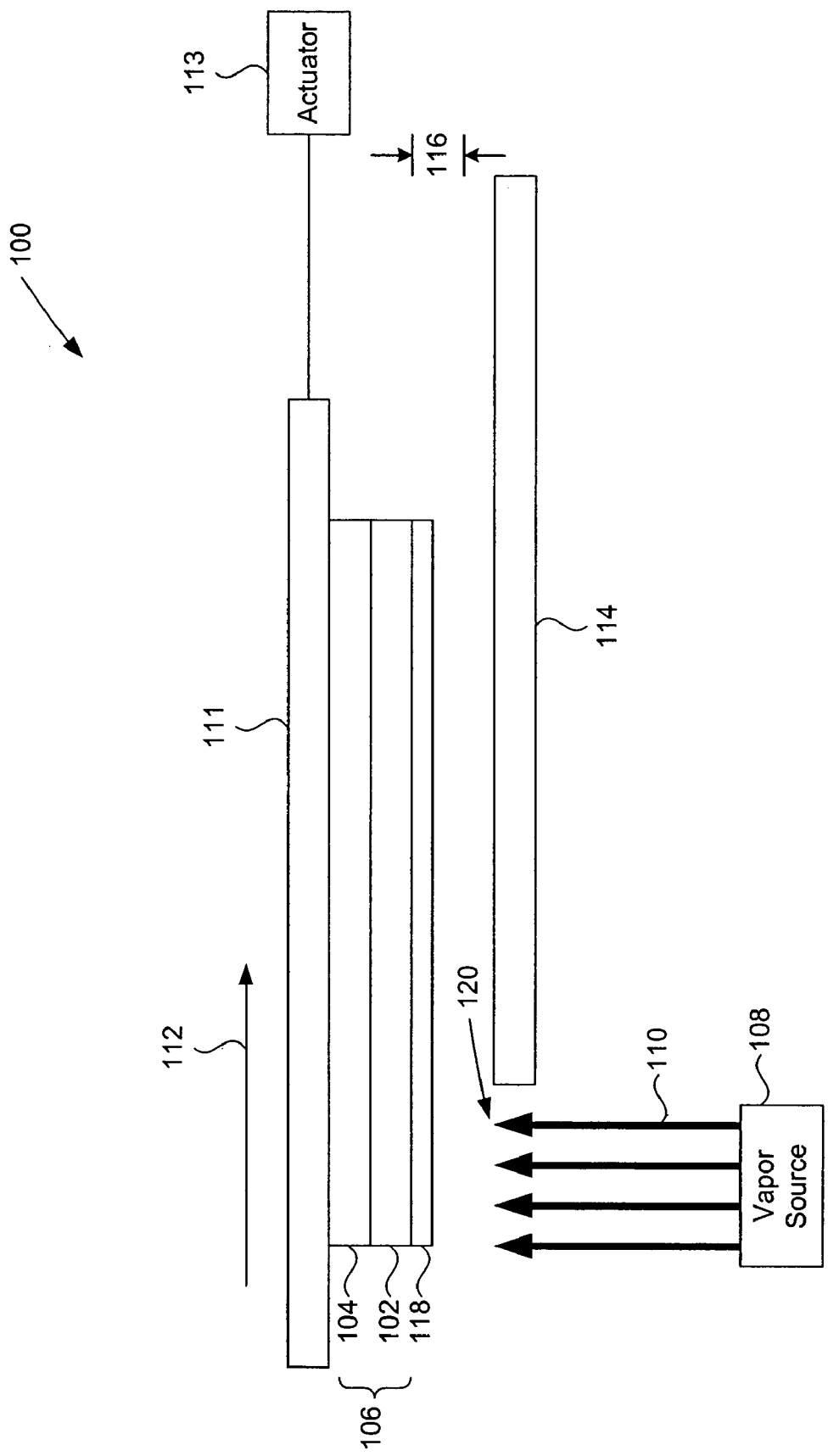

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provide systems and methods to modify a layer on a pattern generator substrate used to form a pattern generator. This modification is done before the layer is diced to form a plurality of programmable patterning devices making up the pattern generator. The modification produces a reflected light beam pattern reflecting from the pattern generator having a trapeziodal shape at an image plane.

Figure 4:
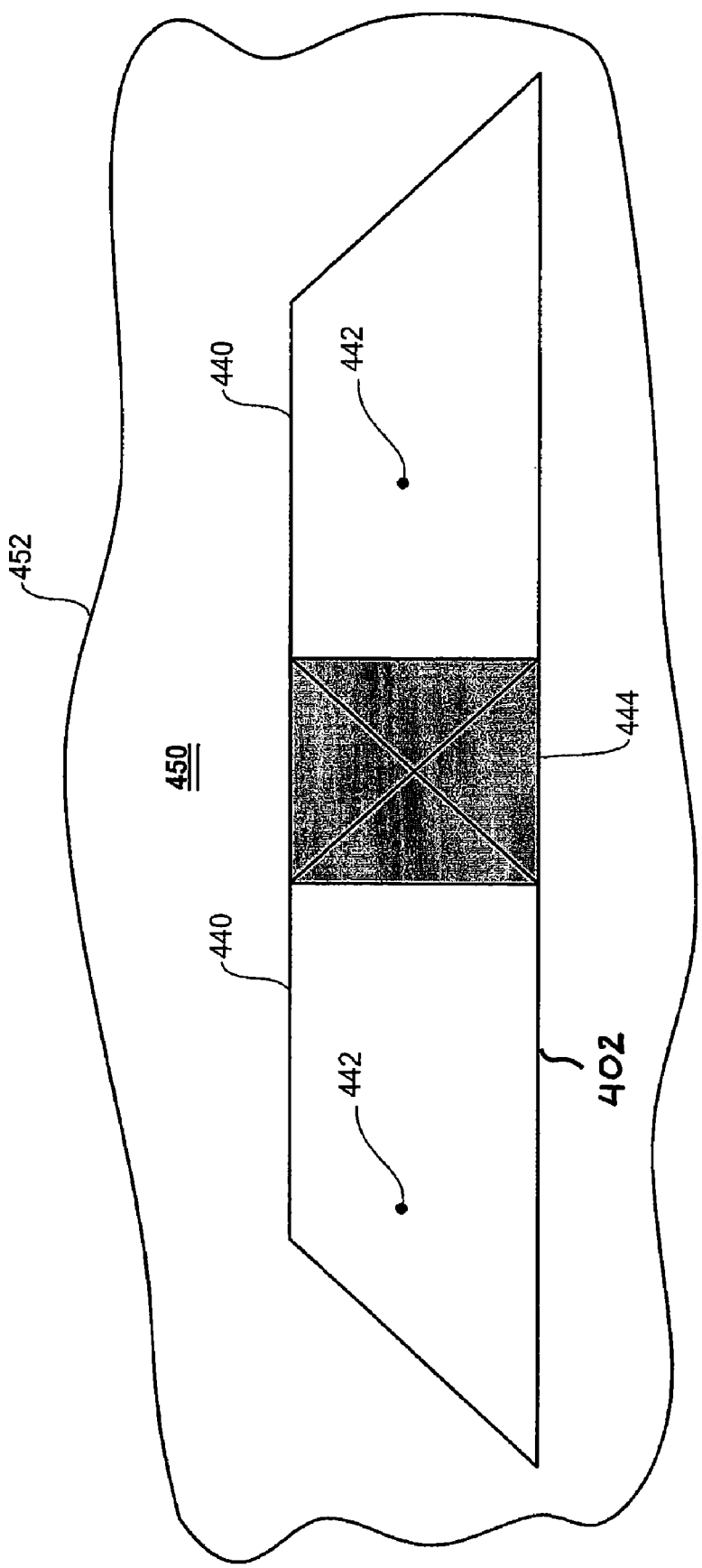
FIG. 4 shows a portion of a layer on a substrate having overlapping trapezoidal shaped features, according to one embodiment of the present invention.

FIG. 4 shows a portion of a layer 450 of a substrate 452 having overlapping trapezoidal shaped features 440, according to tone embodiment of the present invention. In one example, radiation forming features 440 is directed towards layer 402 so that a center 442 of each feature is formed at a certain target spot on layer 450. In this example, even if centers 442 are slightly misaligned, features 442 should still overlap at area 444 because of their trapezoidal shape.

In various examples, the layer is modified using various vapor deposition techniques in conjunction with moving or positioning the pattern generator a desired distance from a blocking device and/or at a desired rate or speed.

Patterning an object substrate at the image plane with the trapezoidal light beam eases tolerances of positioning one footprint of a feature next to another footprint of a feature that are formed adjacent one another on the object substrate. In one example, the trapezoidal light beam allows for gray scaling of features that are next to each other. Using the trapezoidal light beam, even if positions of formation of centers of adjacent footprints is slightly misplaced, the features will mostly still overlap because of the trapezoidal shapes.

Thus, in order to ease stitching of the fields created by one or more pattern generators, the pattern generator may be illuminated with a trapezoidal intensity profile in both X and Y directions. From each edge of the pattern generator, the intensity would increase from ~2% to 100% in the space of 40×8 micron mirrors. This is done in the exemplary embodiments discussed below through imprinting the a trapezoid pattern into the pattern generator. This can be used to relax alignment constraints on an illuminator and minimize impact on pupil apodization and image shift through focus since it is done at an image plane.

In the exemplary embodiments below, this can be done without inducing any stress by a film on the layer of the pattern generator, which might cause the mirror to cup or bow, perhaps enough to make it unusable. This is done using physical vapor deposition (PVD) or photochemical vapor deposition (photo-CVD) of a non-dense, highly absorbing, preferably low index material. In this example, "low index" is to limit reflection off the material and "non-dense" is to lower the material's index, increase scattered versus reflected light, and to limit stress induced into the mirror.

Terminology

Throughout the description, the use of the terms "pattern generator" and "pattern generating device(s)" includes a reflective or transmissive reticle, a contrast device, a liquid crystal display, a spatial light modulator, a grating light valve, a digital mirror device, or any other device that can be used to impart a pattern onto a light beam, as will become apparent to one or ordinary skill in the art upon reading this description.

Also, the use of "system" or "lithography system" is meant to include photolithography, direct write lithography, maskless lithography, immersion lithography, and the like.

Further, the use of "light" or "radiation" is meant to include any wavelength desired for a particular application.

Vapor deposition refers to any process in which materials in a vapor state are condensed through condensation, chemical reaction, or conversion to form a solid material. These processes are used to form coatings that alter the mechanical, electrical, thermal, optical, corrosion resistance, and/or wear properties of a substrate or layer. They are also used to form free-standing bodies, films, and fibers and to infiltrate fabric to form composite materials. Vapor deposition processes usually take place within a vacuum chamber.

There are two categories of vapor deposition processes: physical vapor deposition (PVD) and chemical vapor deposition (CVD). PVD comprises bombarding a target with a plasma. Material dislodged from the target is deposited on a workpiece (e.g., a substrate). CVD comprises thermally reacting gases in a coating chamber. The product of the chemical reaction is deposited on the substrate. A subcategory of CVD is photo-CVD. Photo-CVD is a process during which a chemical vapor reaction driven by the absorption of radiation occurs and a reaction product is deposited on a layer on a substrate. Thus, further developed techniques can be used in connection with the present invention.

Overview of Environment for a Pattern Generator

As discussed above, during lithography, a substrate, which is disposed on a substrate stage, is exposed to an image (e.g., a pattern) formed by a pattern generator, or a plurality (e.g., an array) thereof. The image is projected onto a layer of the substrate by projection optics located within a lithography apparatus. While projection optics are used in the case of lithography, a different type of exposure apparatus can be used depending on the particular application. For example, an excimer laser, x-ray, ion, electron, or photon lithography can each require a different exposure apparatus, as is known to those skilled in the art. The particular example of photolithography is discussed here for illustrative purposes only.

Pattern generators are used in lithography systems to pattern light, which forms images that are used to form features on a substrate. Such substrates can include those used in the manufacture of flat panel displays (e.g., liquid crystal displays), circuit boards, integrated circuits, and the like. A frequently used substrate for such applications is a semiconductor wafer or flat panel display substrate (formed of glass, for example). While a portion of this description is written in terms of a semiconductor wafer for illustrative purposes, one skilled in the art would recognize that this description also applies to other types of substrates known to those skilled in the art. Typically, reticles (or masks), spatial light modulators (SLMs) or contrast devices (hereinafter, both are referred to as SLMs), such as digital mirror devices (DMDs), liquid crystal displays (LCDs), grating light valves (GLVs), or the like, or any other elements that include a transmissive and/or reflective pattern can be used as pattern generators.

A dynamic pattern generator can include an active area having an n×m (wherein n and m are integers greater than 1) array of active devices (or pixels). For example, active areas can include, but are not limited to, an array of mirrors on a DMD, an array of gratings or ribbons on a GLV, or an array of reflective/transmissive devices on the LCD. Each active device is individually controlled to move the active devices between ON and OFF through one or more discrete states.

For example, if the active devices are mirrors on the DMD, each of the mirrors is individually controlled to rotate, tilt, or piston the mirror to either binary or multiple positions. As another example, if the active devices are ribbons in a GLV, sets of ribbons can be deformed or straightened to allow reflection or diffraction of incoming light beams.

It is to be appreciated that controlling the active devices in active areas so that they are partially or fully ON or OFF is well known in the art, and not fully described herein for brevity. Typically, a predetermined and previously stored algorithm based on a desired exposure pattern is used to turn ON (or partially ON) and OFF the active devices, as is known in the relevant arts.

The projected image produces changes in the characteristics of a layer (e.g., photoresist) deposited on the layer of the substrate. These changes correspond to features in the image projected onto the substrate during exposure. Subsequent to exposure, the layer can be processed to modify or create features therein. The features correspond to the pattern projected onto the substrate during exposure. This patterned layer is then used to remove or further process exposed portions of underlying structural layers within the substrate, such as conductive, semiconductive, or insulative layers. This process is then repeated, together with other steps, until the desired structure has been formed.

Step-and-scan technology works in conjunction with a projection optics system that has a narrow imaging slot. Rather than expose the entire substrate at one time with the image formed by the pattern generator, fields are scanned onto the substrate through an imaging slit. This is accomplished by moving the substrate and controlling active devices on the pattern generator, such that the imaging slot is moved across the field during scanning. The substrate stage is stepped between field exposures to allow multiple copies of the pattern to be formed. In this manner, the quality of the image projected onto the substrate is maximized.

The description will now address processing of a pattern generator itself to form a pattern generator that produces trapezoidal shaped radiation beams, in accordance with the present invention.

First Exemplary Pattern Generator Formation Process

FIG. 1 shows a system 100, according to one embodiment of the present invention. In one example, system 100 is a physical vapor deposition (PVD) device comprising a vapor source 108, a holder 111, an actuator 113, and a blocking device 114. In one example, system 100 is used to modify a layer 102 of a substrate 104 of a pattern generator 106 supported by holder 111. In one example, layer 102 is a reflective layer that, after the procedure described below, is diced to form light patterning devices of a DMD.

A vapor source 108 directs vapors 110 towards layer 102 to alter layer 102. During vapor deposition pattern generator 106 is moved in the direction of arrow 112. The moving can be accomplished by coupling substrate 104 to holder 111, which is coupled to actuator 113.

During vapor deposition, a blocking device 114 blocks some of vapor 110 from reaching layer 102. In one example, blocking device 114 is made from stainless steel, finished aluminum, or various engineering plastics (e.g., DELRIN, or the like). A gap 116 between layer 102 and blocking device 114 is used to control deposition of vapor 110 on layer 102. In one example, gap 116 is about 1 micron to about 10 microns.

In this embodiment, a portion of layer 102 is exposed to vapor 110 through use of blocking device 114. A thickness profile of a film or coating 118 (hereinafter coating 118) formed when vapors 110 interact with layer 102 is controlled by controlling a speed of the moving of substrate 108 through and a size of an exposure window (slit) 120 created by blocking device 114, and possibly additionally by a size of gap 116. Thus, in this embodiment, coating of substrate 104 can be done at a desired vapor deposition rate and/or vapor exposure time.

In one example, coating 118 is deposited at rates ranging from about 0.1 to about 10 Angstrom/sec to obtain a desired profile (not shown). In this example, a film thickness will vary between about 100 to about 400 Angstrom, so total coating time will be from about 10 to about 4000 seconds. Assuming, in this example, that the trapezoid slope will be about 0.5 mm long, a drag rate will vary from about 0.05 mm/sec to about 0.000125 mm/sec. In this example, an optical extinction should slope from 0 to 98% in roughly 0.5 mm, thus vapor 210 is chosen from materials that will yield 98% extinction with thickness between 10 and 40 nm.

Using the system and method of this embodiment, a reflectivity of layer 102 is modified so that a reflected footprint of radiation interacting with layer 102 is trapezoidal. For example, vapor 110 can form a coating 118 that absorbs radiation interacting with it, instead of reflecting radiation interacting with it.

As would become apparent to one of ordinary skill in the art upon reading this description, the use of various materials for vapor 110 is contemplated within the scope of the present invention. In one example, vapor 110 can be, but is not limited to, a variety of metal oxides and sub-oxides, such as silicon monoxide, sub-stoichiometric alumina, chrome oxide, tantalam oxide, titanium dioxide, niobium oxide, or the like.

As discussed above, when pattern generator 106 is used in a lithography tool, allowing for trapezoidal reflected footprints allows pattern generator 106 to more easily stitch adjacent features (see FIG. 4) formed on a patterned substrate (see FIG. 4).

Second Exemplary Pattern Generator Formation Process

Figure 2:
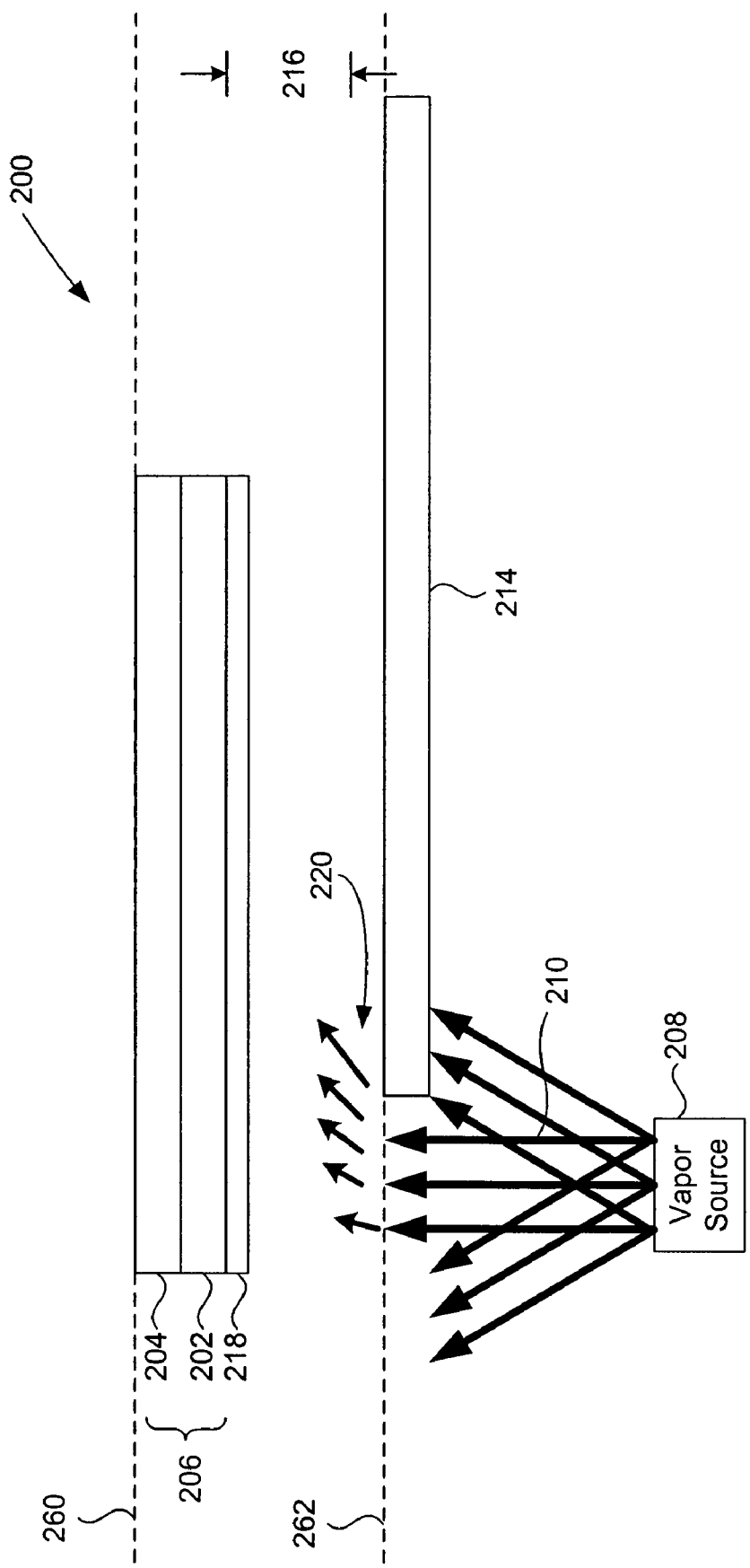

FIG. 2 shows a system 200, according to one embodiment of the present invention. In one example, system 200 is a physical vapor deposition (PVD) system comprising a vapor source 208 and a blocking device 214. In one example, system 200 is used to modify a layer 202 of a substrate 204 of a pattern generator 206. In one example, layer 202 is a reflective layer that, after the procedure described below, is diced to form programmable light patterning devices of a DMD.

A vapor source 208 directs vapors 210 towards layer 202 to alter layer 202. During vapor deposition, a blocking device 214 blocks some of vapor 210 from reaching layer 202. In one example, materials for blocking device 214 are similar to those described above for blocking device 114. In this embodiment, blocking of vapor 210 can also be referred to as shadowing. There is a gap 216 between layer 202 and blocking device 214. In one example, gap 216 is between about 0.2 mm to about 1 mm.

It is to be appreciated that other systems can also be used to move substrate 204, as would become apparent to one of ordinary skill in the art upon reading this description, which are all contemplated within the scope of the present invention.

In this embodiment, a portion of layer 202 is exposed to vapor 210 through use of blocking device 214. A thickness of a coating 218 formed when vapors 202 interact with layer 206 is controlled by controlling gap 216. Additionally, or alternatively, a thickness of coating 218 can be controlled based on an angle between of axis 260 that is in or parallel to a plane of pattern generator 206 with respect to axis 262 that is in or parallel to a plane of blocking device 214. The distribution of vapor paths can be controlled by controlling the pressure of the vapor. By controlling gap 216 and/or an angle between axes 260 and 262, the distribution of vapor path angles that reach various parts of the substrate may be controlled and thus the thickness of the coating can be controlled spatially. In one example, this embodiment uses other factors, for example, but not limited to, scattering of vapor 210 near diffraction area 220 to control a thickness of coating 218.

As described above with reference to FIG. 1, in one example, an arrangement of exposure window 120 can be used to cause grey scaling of coating 218 formed on layer 202. This is done by adjusting a size of gap 216 and/or the angle described above. Thus, in this embodiment there is no relative movement between substrate 204 and blocking device 214. This allows for different exposure times or amounts of exposure of vapor 210 over different portions of layer 202.

In one example, coating 218 is deposited at rates ranging from about 0.1 to about 10 Angstrom/sec to obtain a desired profile (not shown). In this example, a maximum film thickness desired will be from about 100 to about 400 Angstrom, so total coating time will be from about 10 to about 4000 seconds. In this example, an optical extinction should slope from 0 to 98% in roughly 0.5 mm, thus vapor 210 is chosen from materials that will yield 98% extinction with thickness between 10 and 40 nm.

As would become apparent to one of ordinary skill in the art upon reading this description, the use of various materials for vapor 210 is contemplated within the scope of the present invention. In one example, coating 218 can be made from similar materials as coating 218, described above.

As discussed above, when pattern generator 206 is used in a lithography tool, allowing for trapezoidal reflected footprints allows pattern generator 206 to more easily stitch adjacent features (see FIG. 4) formed on a patterned substrate (see FIG. 4).

Third Exemplary Pattern Generator Formation Process

Figure 3:
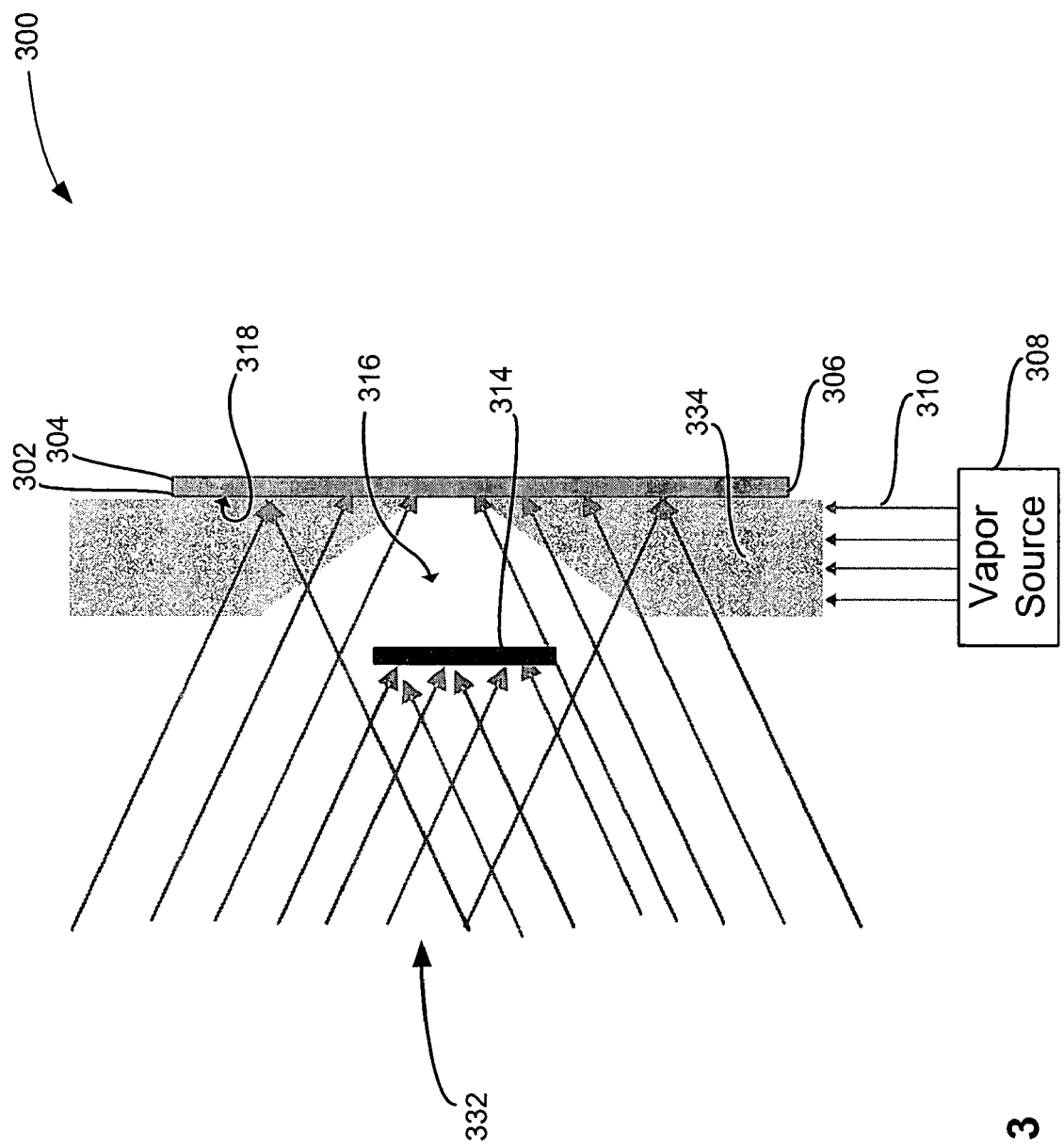

FIG. 3 shows a system 300, according to one embodiment of the present invention. In one example, system 300 is used to modify a layer 302 of a substrate 304 of a pattern generator 306. In one example, layer 302 is a reflective layer that, after the procedure described below, is diced up to form programmable light patterning devices of a DMD.

A radiation source (not shown) directs radiation 332 towards layer 302 that is surrounded by a vapor 310 from a vapor source 308 so as to alter layer 302. In one example, system 300 is a photo chemical vapor deposition (photo-CVD) system. Also, in one example, radiation 332 has a wavelength in a range of about 248 nm to about 350 nm, or other wavelengths in the ultra violet or deep ultra violet.

When photo-CVD is used, a chemical vapor reaction driven by the absorption of radiation 332 occurs and a reaction product 318 is deposited on a layer 302. During this photo-CVD process, a blocking device 314 blocks some of radiation 332 from reaching layer 302. In one example, blocking device 314 is made from similar materials as blocking devices 114 and 214. There is a gap 316 between layer 302 and blocking device 314.

Radiation 332 interacting with blocking device 318 forms cones of radiation that impinge on layer 302. A size of the cone of radiation correlates to a size of gap 316. For example, for a narrow cone of light blocking device 318 is moved father away from layer 302 than for a broader cone of radiation.

Scanned or rasterized radiation will work as well.

In this embodiment, pattern generator 306 is immersed in a vapor 310 that only adheres to parts of pattern generator 306 that are illuminated by radiation 332. By controlling illumination level and/or vapor pressure, a thickness of coating 318 can also be controlled. In one example, this is done using, for example, a knife edge or a pupil stop as blocking device 314, which produces an intensity gradient or profile 334. Controlling of light intensity profile 334 is used to control a deposition rate gradient or thickness gradient that forms varying thickness of coating 318.

As would become apparent to one of ordinary skill in the art upon reading this description, the use of various materials for vapor 310 is contemplated within the scope of the present invention. For example, vapor 310 can be, but is not limited to, one or a variety of organo arsenate, organo titanium, which can be photo-converted into titanium dioxide, $SO_2$, which can be photo-converted to ammonium sulfate, or the like.

Exemplary Operation

Figure 5:
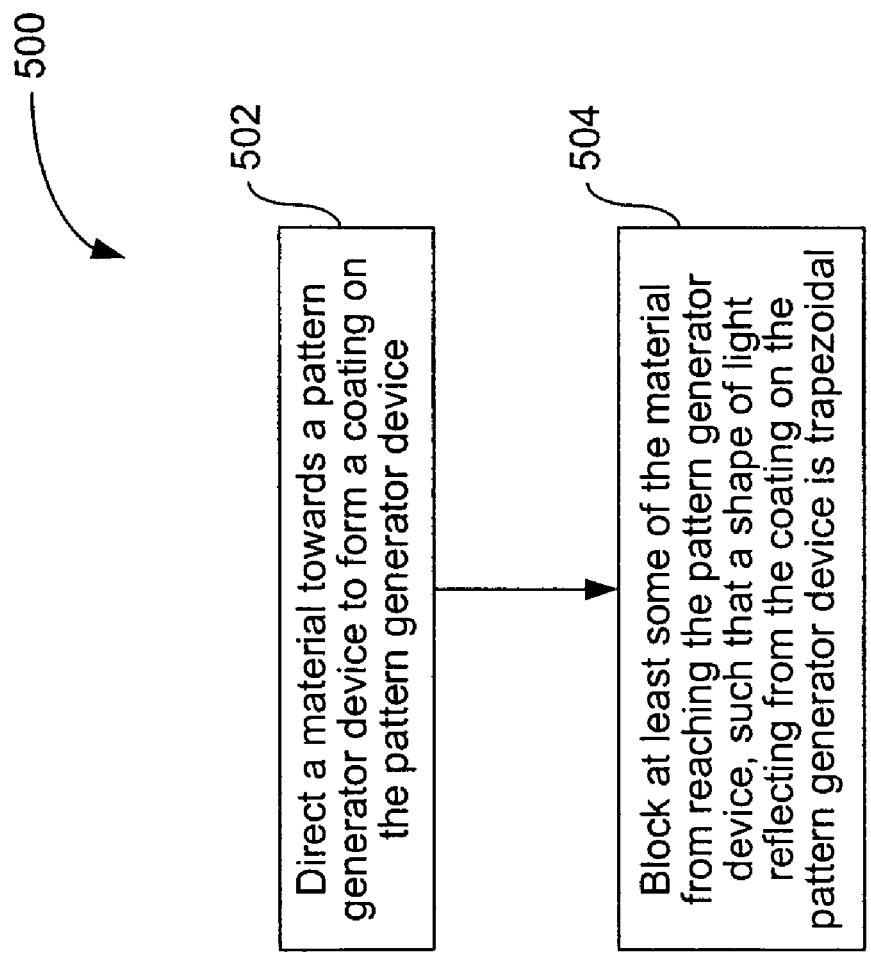
FIG. 5 is a flowchart depicting a method, according to one embodiment of the present invention.

FIG. 5 is a flowchart depicting a method 500, according to one embodiment of the present invention. Method 500 can be used to implement the embodiments shown in FIGS. 1-3, or other operations as would become apparent to one of ordinary skill in the art upon reading and understanding this description.

In step 502, a material is directed towards a pattern generator device to form a coating on the pattern generator device. In step 504, a blocking device is used to block at least some of the material from reaching the pattern generator device, such that a shape of light reflecting from the coating on the pattern generator device is trapezoidal.

In an alternative embodiment to those discussed above, a laser-based writing method can be used to alter a layer of a pattern generator substrate so that radiation interacting with the layer forms trapezoidally shaped radiation beams. In this embodiment, light is scanned across a layer on a substrate at desired rates to gain a trapezoidal shaped feature on the substrate. This can be done by turning the laser on and off or by changing a scaling of intensity from the laser.

Exemplary Velocity and Coating Profile

Figure 6:
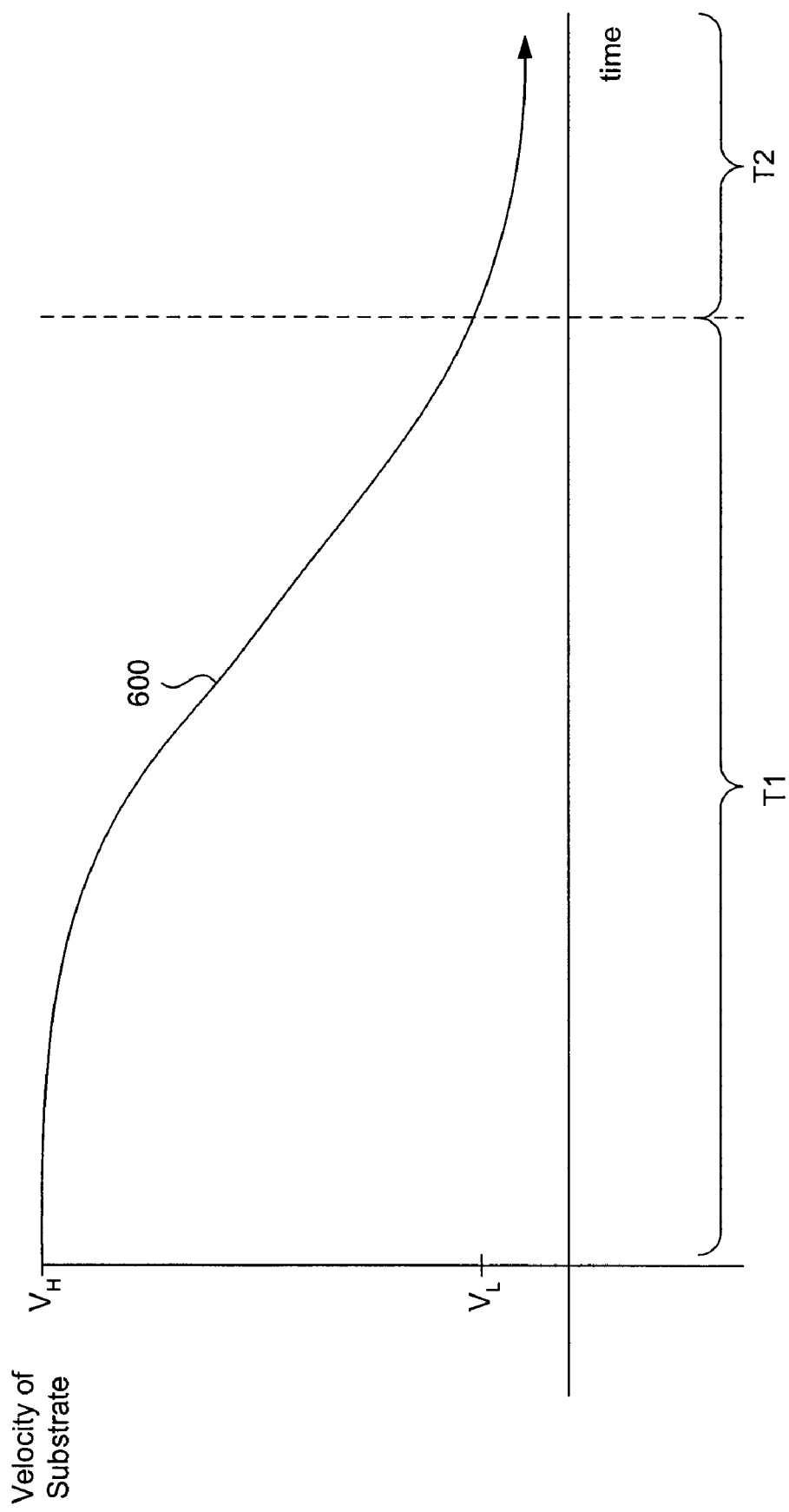
FIG. 6 is a graph showing velocity over time for movement of a pattern generator substrate, according to one embodiment of the present invention.
Figure 7:
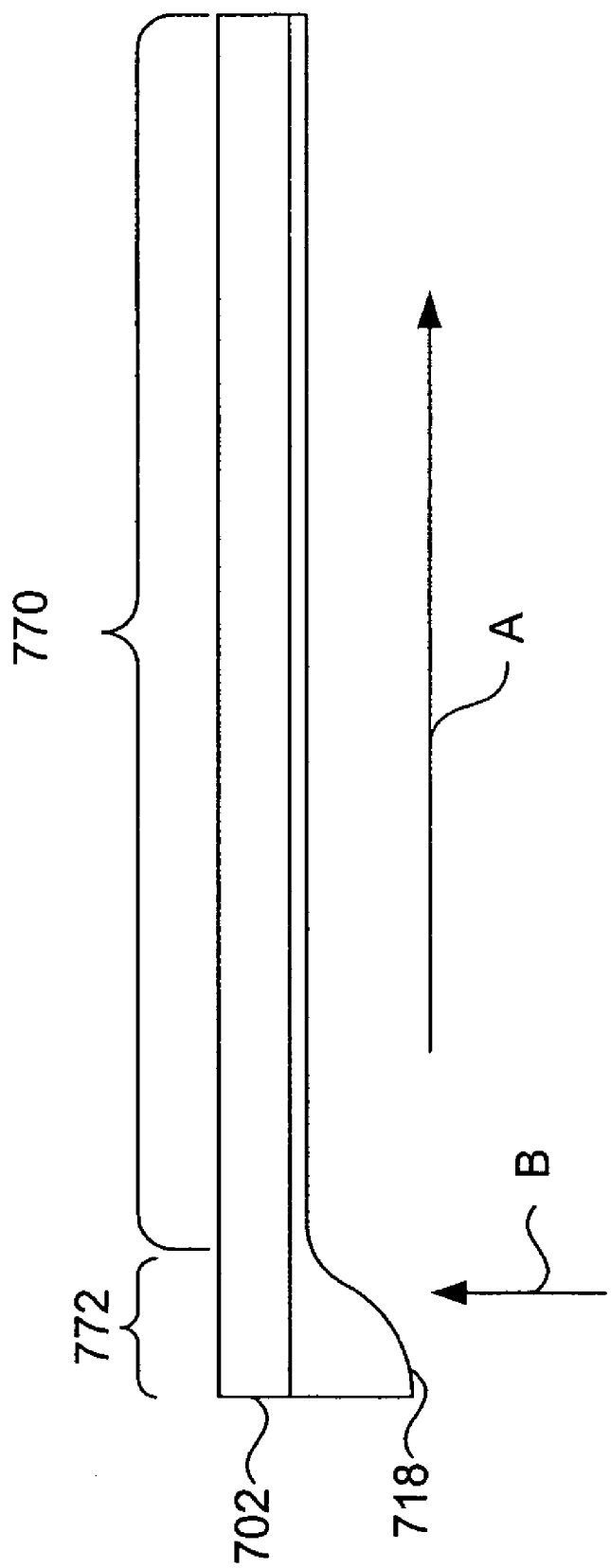
FIG. 7 is a side-view of a coating profile formed from the operation shown in the graph of FIG. 6.

FIGS. 6 and 7 show an exemplary velocity-time graph 600 and an exemplary profile of a coating 718 formed according to graph 600, in one embodiment of the present invention. This can be used in connection with the first exemplary process described in relation to FIG. 1. In this embodiment, a velocity of substrate 106 would start very high ($V_H$) for a first time period T1 and change to very low velocity ($V_L$) for a second time period T2. This results in a small thickness of coating 718 over area 770 and a larger thickness of coating 718 over area 772 when substrate 702 moves in the direction of arrow A and a modification device is positioned below arrow B.

CONCLUSION

While various embodiments of the present invention have been described above, it should be understood that they have been presented by way of example only, and not limitation.

It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method, comprising:
   (a) directing a material towards a layer of a pattern generator device to form a coating on the layer; and
   (b) blocking at least some of the material from reaching the layer during step (a) using a blocking device, such that a shape of light reflecting from the coating on the pattern generator device is trapezoidal; and
   (c) moving the pattern generator device during step (a), such that the pattern generator device is maintained parallel to the blocking device.

2. The method of claim 1, wherein step (a) comprises using vapor deposition.

3. The method of claim 1, wherein step (a) comprises using physical vapor deposition.

4. The method of claim 1, wherein step (a) comprises using photochemical vapor deposition.

5. The method of claim 1, further comprising controlling a thickness of the coating through control of a rate of the moving in step (c).

6. The method of claim 1, further comprising controlling a thickness of the coating through control of an exposure time of the material based on controlling the moving in step (c).

7. The method of claim 1, wherein step (a) comprises using physical vapor deposition.

8. A method, comprising:
   (a) directing a material towards a layer of a pattern generator device to form a coating on the layer;
   (b) blocking at least some of the material from reaching the layer during step (a) using a blocking device, such that a shape of light reflecting from the coating on the pattern generator device is trapezoidal; and
   (c) positioning the pattern generator device during step (a) along a plane that forms an acute angle with respect to an edge of the blocking device.

9. The method of claim 8, wherein step (a) comprises using physical vapor deposition.

10. A method, comprising:
    (a) directing a material towards a layer of a pattern generator device to form a coating on the layer;
    (b) blocking at least some of the material from reaching the layer during step (a) using a blocking device, such that a shape of light reflecting from the coating on the pattern generator device is trapezoidal; and
    (c) maintaining the pattern generator device substantially stationary, spaced from, and parallel to the blocking device, such that there is a gap between the pattern generator device and the blocking device;
    wherein a size of the gap is substantially constant in a direction along a longitudinal axis of the blocking device.

11. A method comprising:
    (a) directing a material towards a layer of a pattern generator device to form a coating on the layer;
    (b) blocking at least some of the material from reaching the layer during step (a) using a blocking device, such that a shape of light reflecting from the coating on the pattern generator device is trapezoidal; and
    (c) maintaining the pattern generator device substantially stationary, spaced from, and parallel to the blocking device, such that there is a gap between the pattern generator device and the blocking device;
    wherein a size of the gap continuously increases in a direction along a longitudinal axis of the blocking device.

12. The method of claim 11, wherein a thickness of the coating varies around an edge of the blocking device.

13. The method of claim 12, wherein the edge of the blocking device causes a shadowing effect in the coating.

14. A method, comprising:
    (a) directing a material towards a layer of a pattern generator device to form a coating on the layer;
    (b) blocking at least some of the material from reaching the layer during step (a) using a blocking device, such that a shape of light reflecting from the coating on the pattern generator device is trapezoidal; and
    (c) positioning the blocking device to cover a substantially central layer area of the pattern generator device.

15. The method of claim 14, wherein step (a) comprises using photochemical vapor deposition.

16. A methods, comprising:
    (a) directing a material towards a layer of a pattern generator device to form a coating on the layer;
    (b) blocking at least some of the material from reaching the layer during step (a) using a blocking device, such that a share of light reflecting from the coating on the pattern generator device is trapezoidal; and
    (c) positioning the blocking device as one of a knife edge or a pupil stop.

17. A method comprising for modification of a spatial light modulator (SLM) to aid spatial stitching of images projected by the SLM onto a substrate, comprising:
    (a) directing a modifying material towards a surface of the SLM; and
    (b) modifying a portion of the surface of the SLM to thereby change an optical response of the SLM in a controlled manner, and wherein the SLM is a transmissive SLM.

18. The method of claim 17, wherein step (b) causes the SLM to have a non-varying optical response.

19. The method of claim 17, wherein step (b) causes the SLM to have a continuously varying optical response.

20. The method of claim 19, wherein the continuously varying optical response has a linearly varying profile.

21. The method of claim 19, wherein the continuously varying optical response has a non-linearly varying profile.

* * * * *

UNITED STATES PATENT AND TRADEMARK OFFICE
CERTIFICATE OF CORRECTION

PATENT NO. : 7,335,398 B2 Page 1 of 1
APPLICATION NO. : 10/898160
DATED : February 26, 2008
INVENTOR(S) : Lipson et al.

It is certified that error appears in the above-identified patent and that said Letters Patent is hereby corrected as shown below:

Column 3
Line 14, "trapeziodal" replace with --trapezoidal--.

Column 9
Line 11, "layer; and" replace with --layer;--.

Signed and Sealed this

Twenty-fourth Day of June, 2008

JON W. DUDAS
*Director of the United States Patent and Trademark Office*